(12) United States Patent
Lee et al.

(10) Patent No.: US 10,840,225 B1
(45) Date of Patent: Nov. 17, 2020

(54) PACKAGE-ON-PACKAGE AND PACKAGE CONNECTION SYSTEM COMPRISING THE SAME

(71) Applicant: SAMSUNG ELECTRO-MECHANICS CO., LTD., Suwon-si (KR)

(72) Inventors: Young Kwan Lee, Suwon-si (KR); Young Sik Hur, Suwon-si (KR); Won Wook So, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/531,625

(22) Filed: Aug. 5, 2019

(30) Foreign Application Priority Data

May 9, 2019 (KR) .................. 10-2019-0054427

(51) Int. Cl.
| | |
|---|---|
| *H01L 25/10* | (2006.01) |
| *H01L 23/00* | (2006.01) |
| *H01L 23/522* | (2006.01) |
| *H01L 23/528* | (2006.01) |

(52) U.S. Cl.
CPC ........ *H01L 25/105* (2013.01); *H01L 23/5226* (2013.01); *H01L 23/5283* (2013.01); *H01L 24/17* (2013.01); *H01L 2224/02373* (2013.01); *H01L 2224/02377* (2013.01); *H01L 2224/02379* (2013.01); *H01L 2224/02381* (2013.01); *H01L 2224/0401* (2013.01); *H01L 2225/1058* (2013.01); *H01L 2924/1433* (2013.01); *H01L 2924/1436* (2013.01); *H01L 2924/1438* (2013.01)

(58) Field of Classification Search
CPC . H01L 23/5226; H01L 23/5283; H01L 24/17; H01L 25/105
See application file for complete search history.

(56) References Cited

U.S. PATENT DOCUMENTS

| | | | |
|---|---|---|---|
| 2011/0013353 A1* | 1/2011 | Kwon | H01L 25/18 361/679.31 |
| 2011/0147908 A1* | 6/2011 | Sun | H01L 23/49833 257/686 |
| 2015/0237280 A1 | 8/2015 | Choi et al. | |
| 2016/0338202 A1 | 11/2016 | Park et al. | |
| 2019/0006339 A1* | 1/2019 | Lau | H01L 25/105 |
| 2019/0123023 A1* | 4/2019 | Teig | H01L 25/0657 |

FOREIGN PATENT DOCUMENTS

| | | |
|---|---|---|
| KR | 10-2015-0098094 A | 8/2015 |
| KR | 10-2016-0132763 A | 11/2016 |

* cited by examiner

*Primary Examiner* — Allan R Wilson
(74) *Attorney, Agent, or Firm* — Morgan, Lewis & Bockius LLP

(57) ABSTRACT

A package-on-package and a package connection system including the same are provided. The package-on-package includes a first semiconductor package including a first semiconductor chip, and a second semiconductor package disposed on the first semiconductor package and including a second semiconductor chip electrically connected to the first semiconductor chip. The first semiconductor chip includes an application processor (AP) including a first image signal processor (ISP), and the second semiconductor chip includes a second image signal processor (ISP).

18 Claims, 13 Drawing Sheets

PACKAGE-ON-PACKAGE AND PACKAGE CONNECTION SYSTEM COMPRISING THE SAME

CROSS-REFERENCE TO RELATED APPLICATION(S)

This application claims the benefit under 35 USC 119(a) of Korean Patent Application No. 10-2019-0054427 filed on May 9, 2019 in the Korean Intellectual Property Office, the entire disclosure of which is incorporated herein by reference for all purposes.

TECHNICAL FIELD

The present inventive concept relates to a package-on-package and a package connection system including the same.

BACKGROUND

In recent mobile devices, imaging has become a major feature. Raw data imaged by a camera module passes through a processing process by an image signal processor (ISP). In this case, mobile devices use image signal processors (ISP) embedded in application processors (AP).

SUMMARY

An aspect of the present inventive concept is to provide a package-on-package and a package connection system including the same, in which a camera function may be diversified by further configuring an additional image signal processor (ISP) in addition to an image signal processor (ISP) embedded in an application processor (AP).

An aspect of the present inventive concept, a semiconductor package including an additional image signal processor (ISP), is separately configured, in addition to a semiconductor package including an application processor (AP) in which an image signal processor (ISP) is embedded, and the plurality of semiconductor chips are disposed in the form of a package-on-package.

According to an aspect of the present inventive concept, a package-on-package includes a first semiconductor package including a first semiconductor chip, and a second semiconductor package disposed on the first semiconductor package and including a second semiconductor chip electrically connected to the first semiconductor chip. The first semiconductor chip includes an application processor (AP) including a first image signal processor (ISP), and the second semiconductor chip includes a second image signal processor (ISP).

According to an aspect of the present inventive concept, a package connection system includes a printed circuit board, a package-on-package disposed on the printed circuit board, and an image sensor package electrically connected to the printed circuit board. The package-on-package includes a first semiconductor package including a first semiconductor chip, and a second semiconductor package disposed on the first semiconductor package and including a second semiconductor chip electrically connected to the first semiconductor chip. The first semiconductor chip includes an application processor (AP) including a first image signal processor (ISP), and the second semiconductor chip includes a second image signal processor (ISP).

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
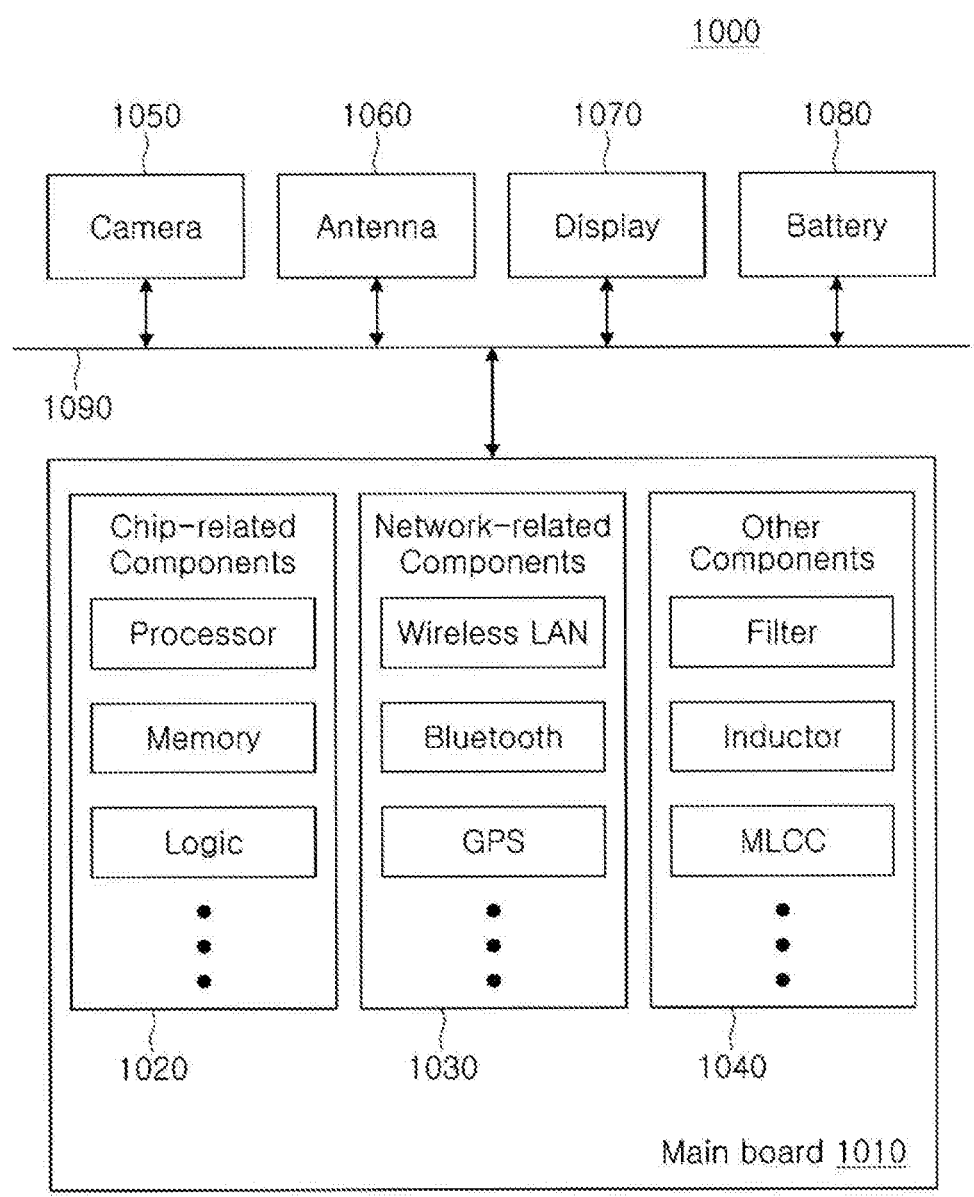
FIG. 1 is a schematic block diagram illustrating an example of an electronic device system.

Hereinafter, examples of the present inventive concept will be described with reference to the accompanying drawings. The shape and size of constituent elements in the drawings may be exaggerated or reduced for clarity.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
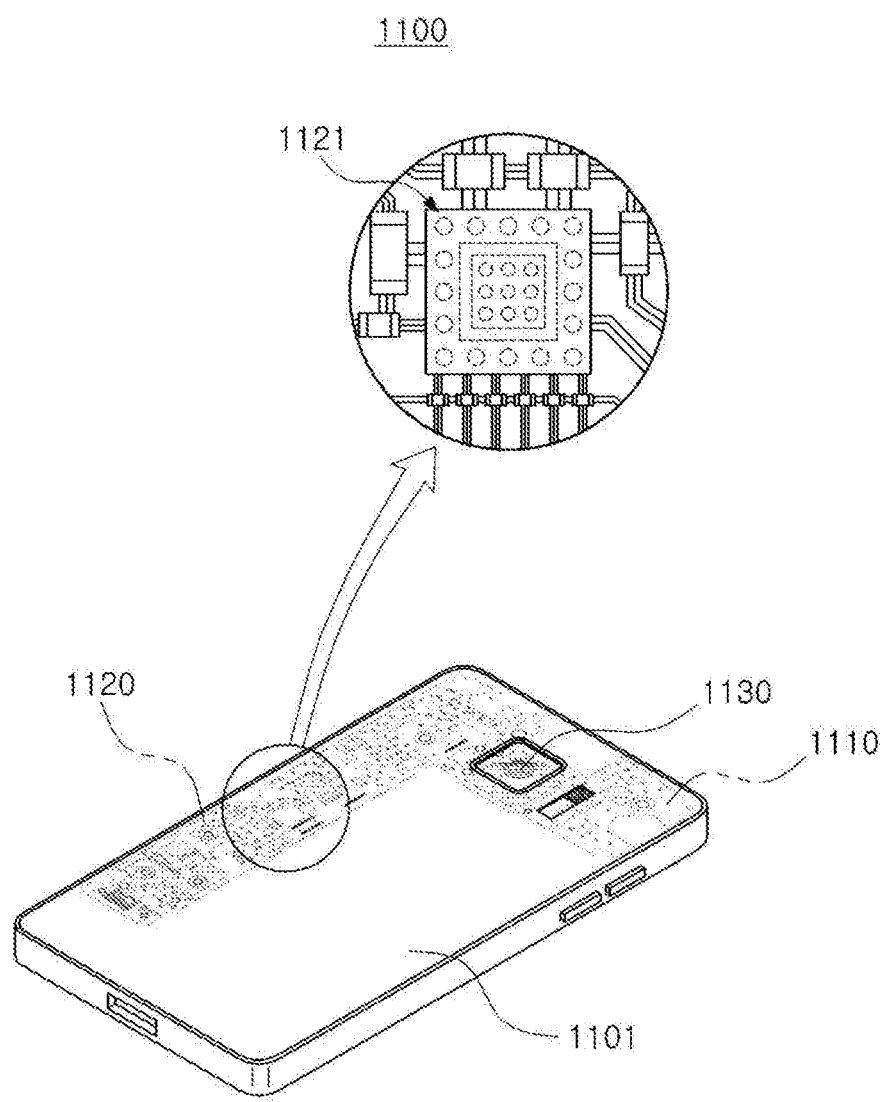
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a printed circuit board 1110 such as a motherboard or the like may be accommodated in a body 1101 of a smartphone 1100, and various electronic components 1120 may be physically or electrically connected to the printed circuit board 1110. In addition, other components that may or may not be physically or electrically connected to the printed circuit board 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

In this case, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
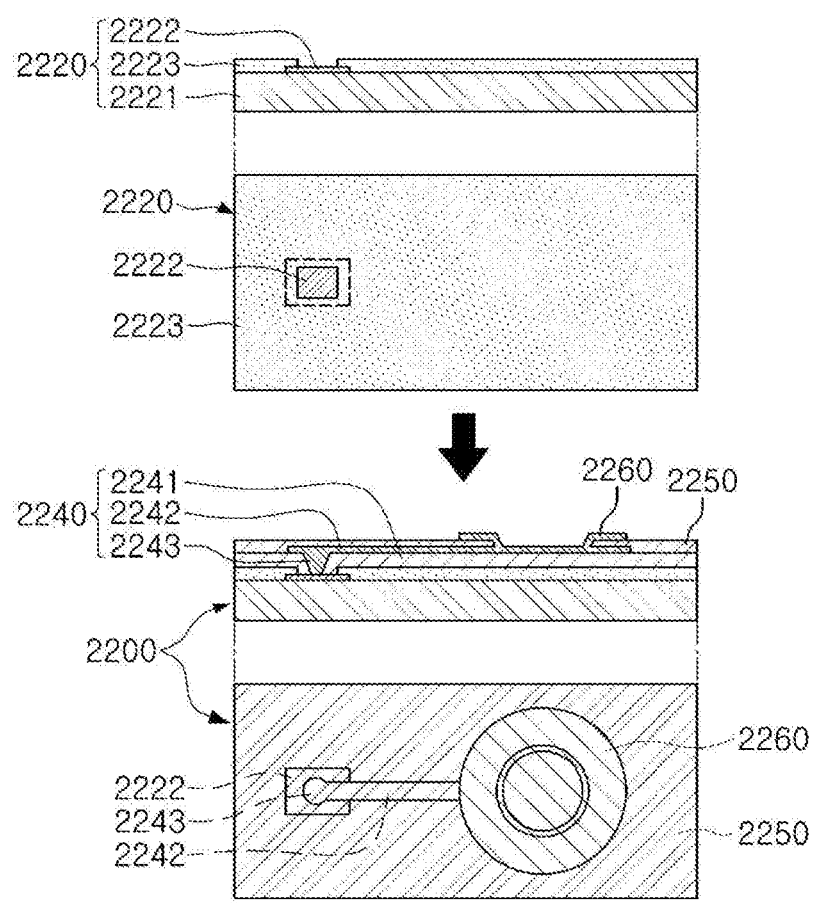
FIGS. 3A and 3B are schematic cross-sectional views illustrating states of a fan-in semiconductor package before and after being packaged.
Figure 3B:
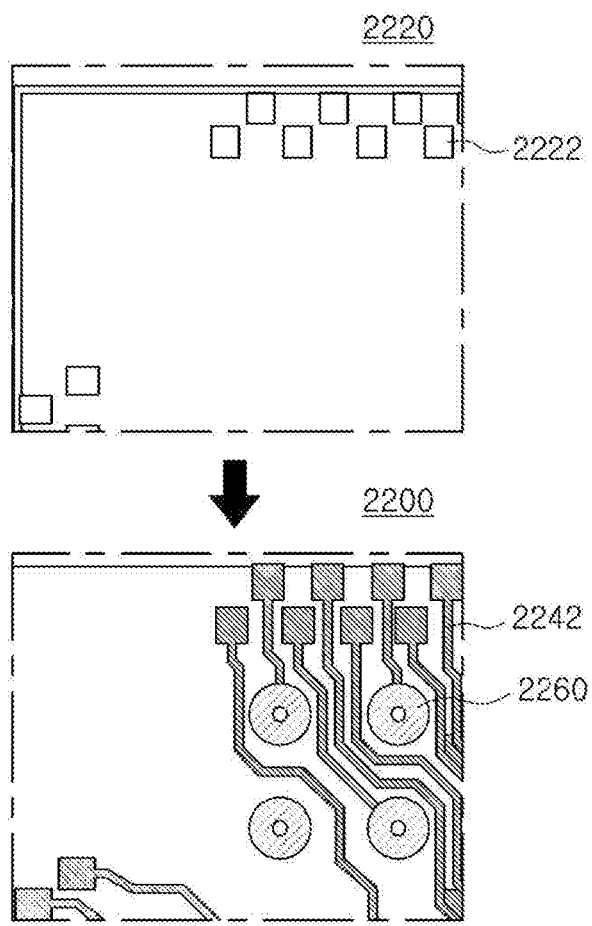

FIGS. 3A and 3B are schematic cross-sectional views illustrating states of a fan-in semiconductor package before and after being packaged.

Figure 4:
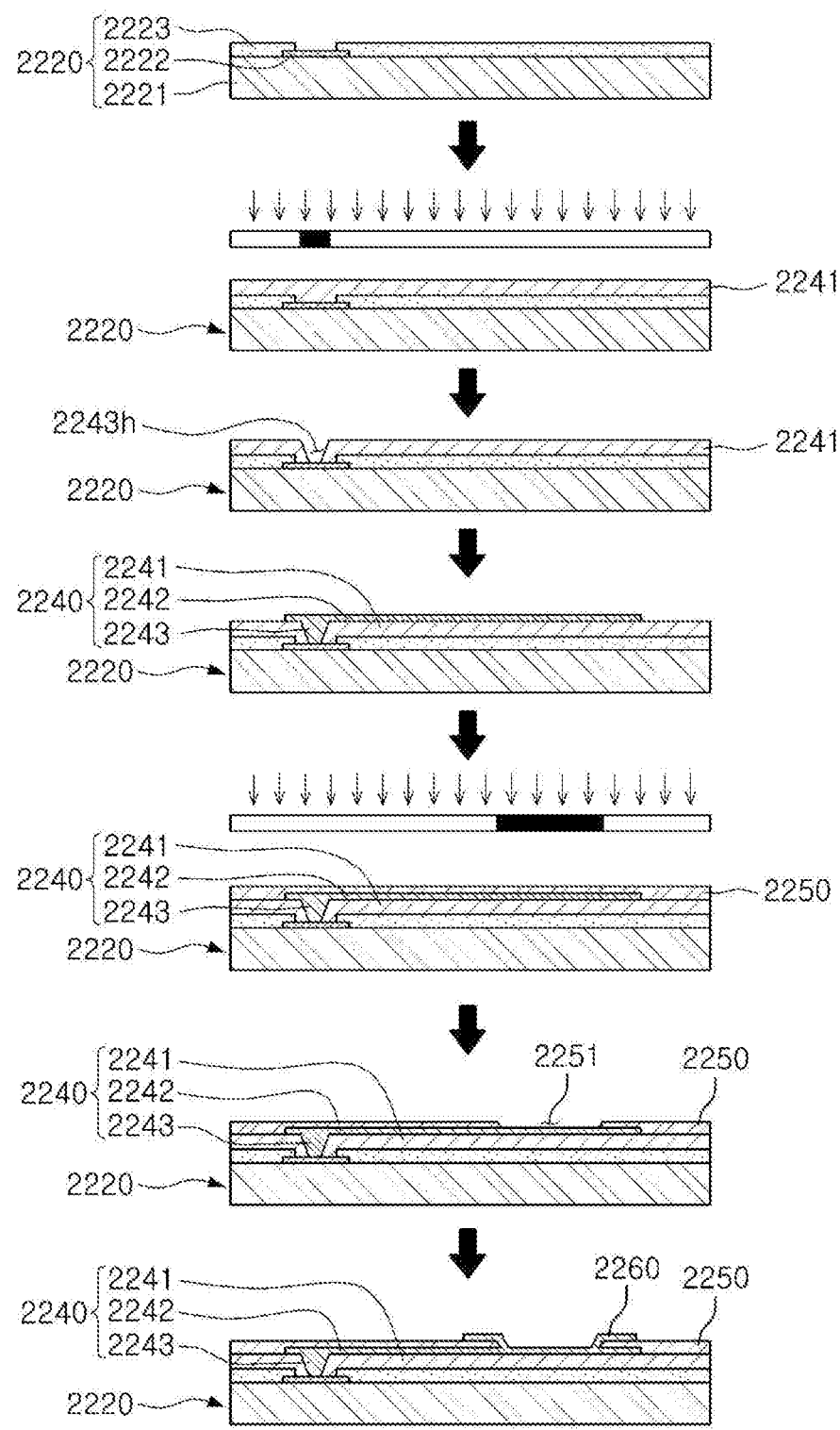
FIG. 4 is a schematic cross-sectional view illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 to redistribute the connection pads 2222. The connection member 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an under bump metal layer 2260, or the like, may be formed. That is, a fan-in semiconductor package 2200 including, for example, the semiconductor chip 2220, the connection member 2240, the passivation layer 2250, and the under bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
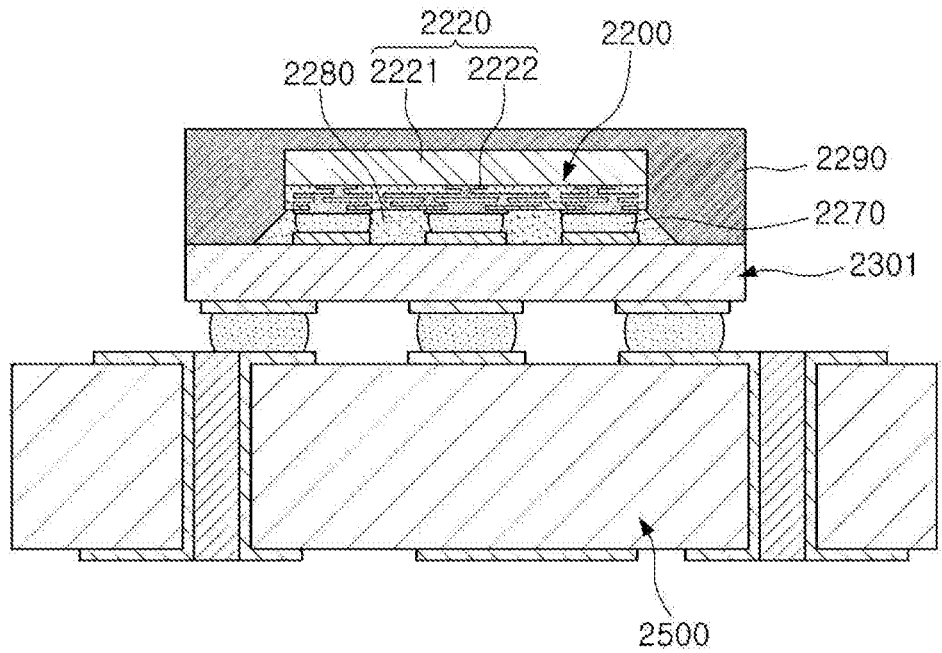
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a printed circuit board (PCB) and is ultimately mounted on a mainboard of an electronic device.

Figure 6:
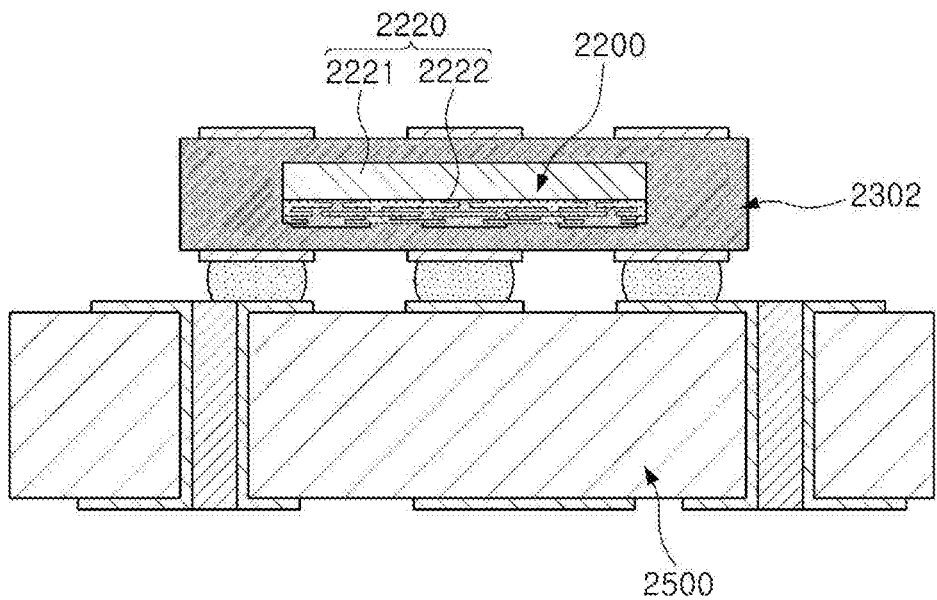
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board (PCB) and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the PCB 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate PCB 2302, connection pads 2222, that is, I/O terminals, of the semiconductor chip 2220 may be redistributed by the PCB 2302 in a state in which the fan-in semiconductor package 2200 is embedded in the PCB 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate PCB and be then mounted on the mainboard of the electronic device through a packaging process or may be mounted and used on the mainboard of the electronic device in a state in which it is embedded in the PCB.

Fan-Out Semiconductor Package

Figure 7:
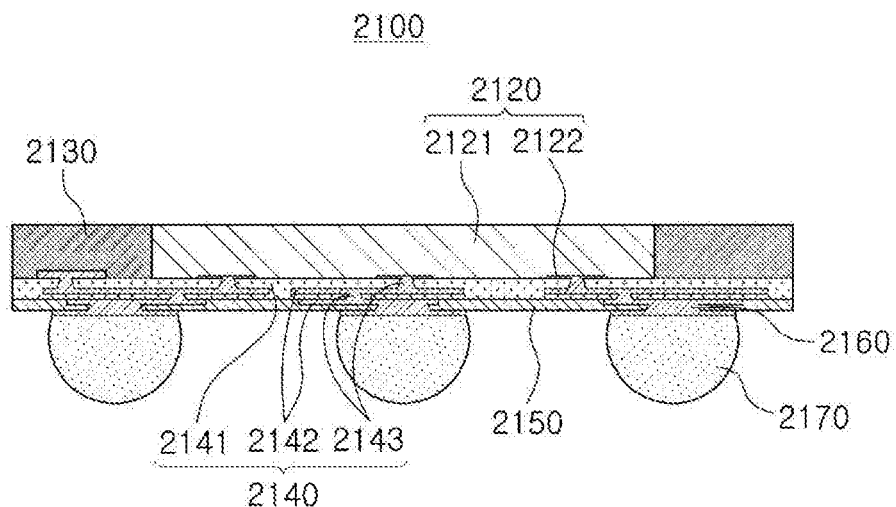
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an under bump metal layer 2160 may further be formed in openings of the passivation layer 2150. Solder balls 2170 may further be formed on the under bump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate PCB, as described below.

Figure 8:
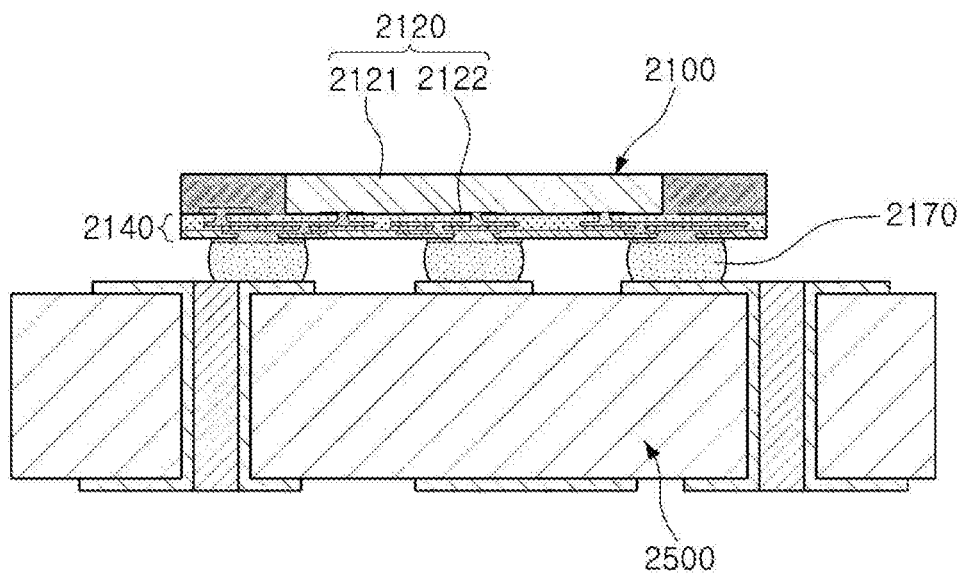
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate PCB, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a PCB, or the like, having a scale, a purpose, and the like, different from those of the fan-out semiconductor package, and having the fan-in semiconductor package embedded therein.

Package-On-Package

Figure 9:
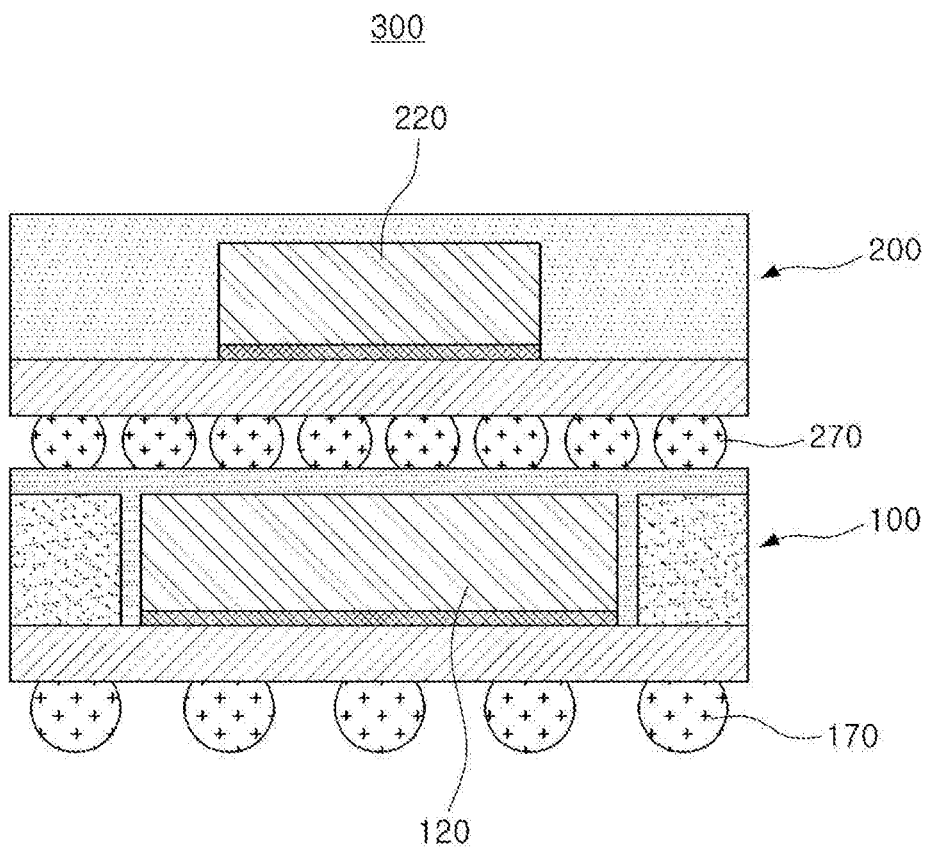
FIG. 9 is a cross-sectional view schematically illustrating an example of a package-on-package.

FIG. 9 is a cross-sectional view schematically illustrating an example of a package-on-package.

Figure 10:
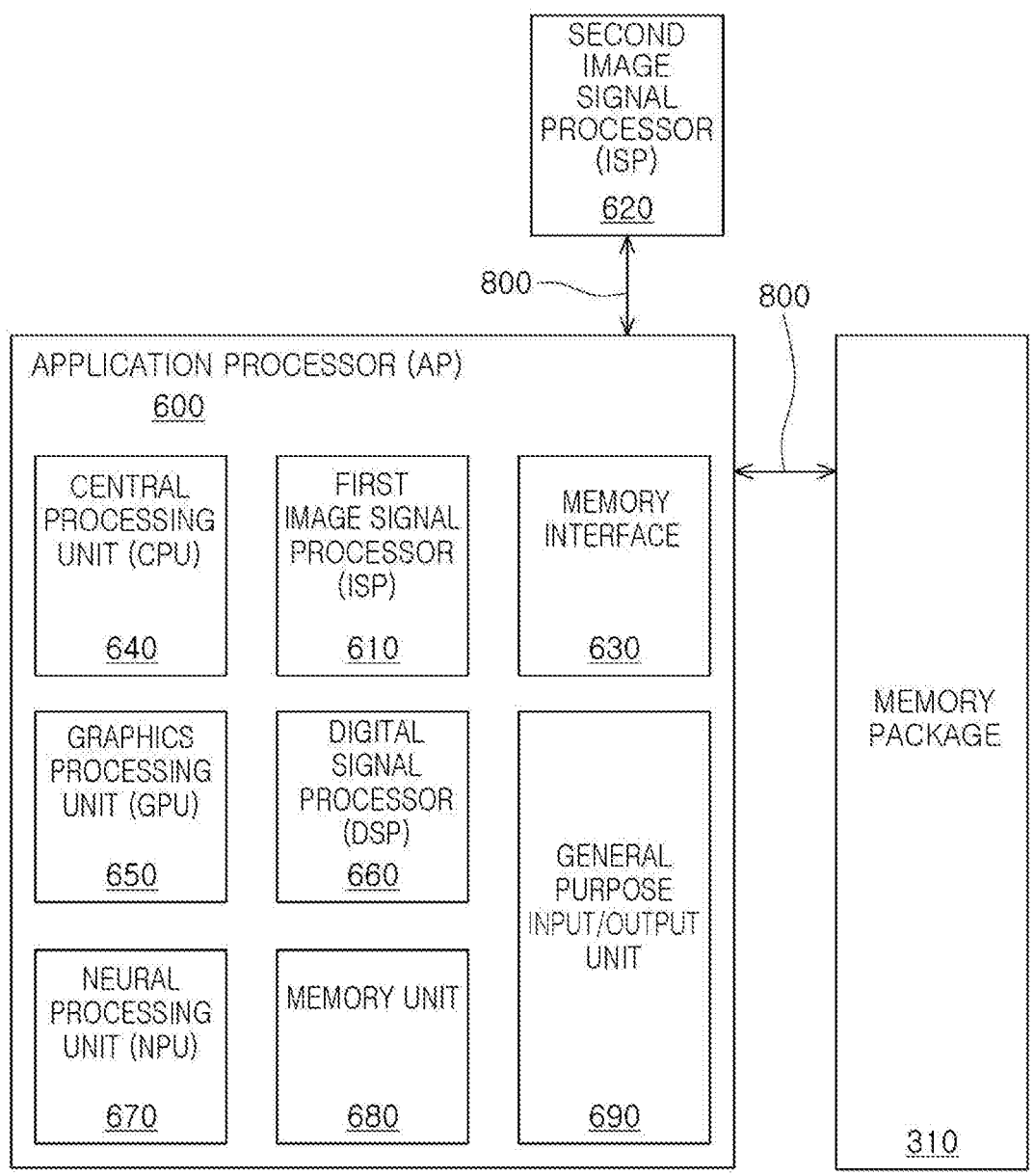
FIG. 10 is a plan view schematically illustrating the arrangement of units of first and second semiconductor chips applied to the package-on-package of FIG. 9.

FIG. 10 is a plan view schematically illustrating the arrangement of units of first and second semiconductor chips applied to the package-on-package of FIG. 9.

Referring to FIGS. 9 and 10, a package-on-package 300 according to an example includes a first semiconductor package 100 including a first semiconductor chip 120, and a second semiconductor package 200 disposed on the first semiconductor package 100 and including a second semiconductor chip 220 electrically connected to the first semiconductor chip 120. The package-on-package 300 having the structure as described above may be mounted on a printed circuit board (PCB) such as a main board, using a first electrical connection metal 170. The first semiconductor package 100 and the second semiconductor package 200 may be physically/electrically connected to each other via a second electrical connection metal 270. Detailed structures of the first and second semiconductor packages 100 and 200 will be described later in detail with reference to the other accompanying drawings.

The first semiconductor chip 120 includes an application processor (AP) 600 including a first image signal processor (ISP) 610.

The second semiconductor chip 220 includes one or more second image signal processors (ISP) 620 that are distinguished from the first image signal processor (ISP) 610.

The application processor (AP) 600 may further include one or more configurations in addition to the first image signal processor (ISP) 610. For example, the application processor (AP) 600 may further include one or more of a central processing unit (CPU) 640, a graphics processing unit (GPU) 650, a digital signal processor (DSP) 660, a neural processing unit (NPU) 670, a memory unit 680, and a general purpose input/output unit 690 for general purpose. In this case, a system-on-chip (SoC) in which each configuration constitutes a single system may be formed. All or portions of the components of the application processor (AP) 600 may be connected to other configurations.

Each of the first image signal processor (ISP) 610 and the second image signal processor (ISP) 620 may include an image receiving unit, an image processing unit, and an image transmitting unit. Accordingly, the first image signal processor (ISP) 610 and the second image signal processor (ISP) 620 may receive and process image data output from the configuration such as an image sensor, a camera module and the like, and may output the processed image data to a configuration in the application processor (AP) 600, or to a configuration outside of the application processor (AP) 600 such as an image processing unit 310 or the like. The image processing unit 310 may correct, for example, the shake of the received image data and may adjust a white balance.

The application processor (AP) 600 may also be connected to other configurations via a bus structure 800. In this case, the application processor (AP) may include an interface for efficiently interfacing with the bus structure 800. In addition, the first image signal processor (ISP) 610 and the second image signal processor (ISP) 620 may share the interface of the application processor (AP). For example, the application processor (AP) 600 may further include a memory interface 630, and the memory interface 630 may be connected to the memory package 310 via the bus structure 800. In this case, each of the first image signal processor (ISP) 610 and the second image signal processor (ISP) 620 is electrically connected to the memory interface 630 of the application processor (AP) 600, and the memory interface 630 may be connected to the memory package 310 via the bus structure. The memory package 310 may be, but is not limited to, an embedded multi-chip package (eMCP) including a dynamic random access memory (DRAM), a flash memory, and a controller (CTR), but is not limited thereto.

Meanwhile, recent mobile devices have utilized image signal processors (ISP) embedded in application processors (AP). In this case, the performance of a camera module is limited by the image signal processor (ISP) embedded in the application processor (AP). Furthermore, it is difficult to embed a high-end image signal processor (ISP) in the application processor (AP) 600 in terms of a yield and costs. Recently, however, with the release of recent mobile devices including two or more camera modules such as a quad rear camera, a dual front camera and the like, an increase in the number of image signal processors (ISP) has been required. However, in the case of further configuring an image signal processor (ISP) in the application processor (AP), miniaturization and thinning of a semiconductor package may not be implemented, as the size of the application processor (AP) increases. Furthermore, with the introduction of an additional image signal processor (ISP), an application processor (AP) design burden, cost increase and yield reduction may be problematic.

As in the package-on-package 300 according to an example, separately from the first image signal processor (ISP) 610 included in the application processor (AP) 600 of the existing first semiconductor package 100, when the second image signal processor (ISP) 620 is additionally configured in the second semiconductor package 200 to be connected thereto, the camera function may be enhanced by the increase in the number of image signal processors (ISP).

In addition, the second image signal processor (ISP) 620, additionally introduced, is not embedded in the application processor (AP) 600 of the first semiconductor package 100, but is embedded in a separate second semiconductor package 200. Thus, the size of the first semiconductor package 100 may be maintained. In addition, problems, such as design burden, cost increase, and yield reduction that may occur when an additional image signal processor (ISP) is disposed in the application processor (AP), may be prevented.

The latency may be significantly reduced when the interface of the application processor AP is shared by the first image signal processor (ISP) and the second image signal processor ISP.

Figure 11:
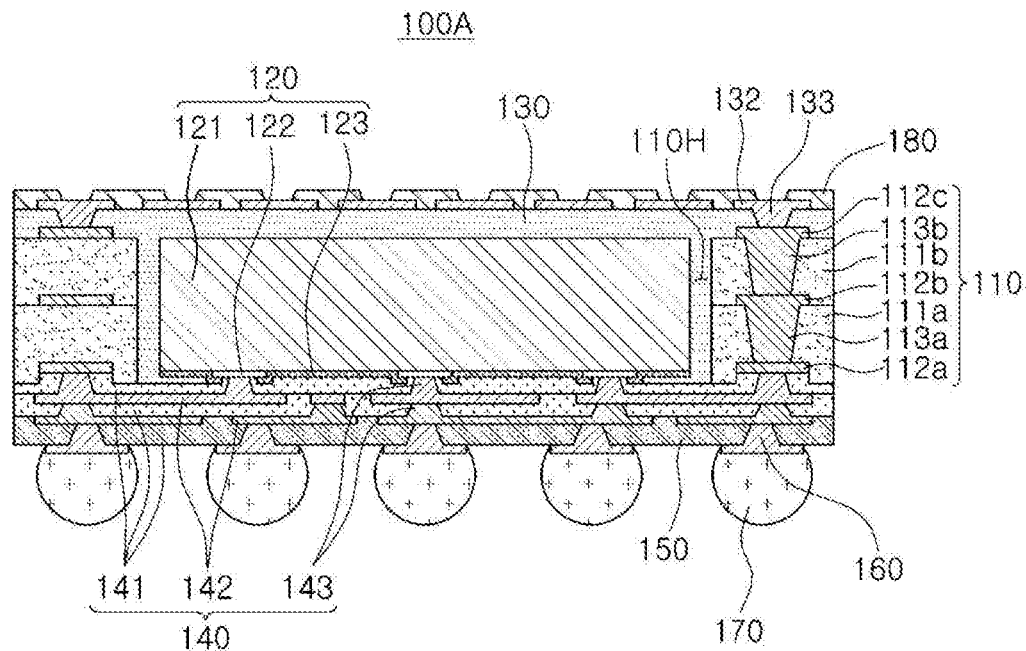
FIG. 11 is a cross-sectional view schematically illustrating an example of a first semiconductor package applied to the package-on-package of FIG. 9.

FIG. 11 is a cross-sectional view schematically illustrating an example of a first semiconductor package applied to the package-on-package of FIG. 9.

Referring to FIG. 11, a first semiconductor package 100A according to an example may include a frame 110 having a penetrating portion 110H and including one or more wiring layers 112a, 112b and 112c, a first semiconductor chip 120 disposed in the penetrating portion 110H and having a first connection pad 122, a first encapsulant 130 covering at least a portion of each of the frame 110 and the first semiconductor chip 120, a backside wiring layer 132 disposed on an upper side of the first encapsulant 130, a backside via 133 passing through the first encapsulant 130 and electrically connecting the backside wiring layer 132 and one or more wiring layers 112a, 112b and 112c, a first connection structure 140 disposed below the frame 110 and the first semiconductor chip 120 and including at least one first redistribution layer 142 electrically connected to the one or more wiring layers 112a, 112b and 112c and the first connection pad 122, a first passivation layer 150 disposed below the first connection structure 140 and having an opening exposing at least a portion of the at least one first redistribution layer 142, a first under bump metal 160 disposed on the opening of the first passivation layer 150 to be electrically connected to the exposed first redistribution layer 142, a first electrical connection metal 170 disposed below the first passivation layer 150 and electrically connected to the first redistribution layer 142 exposed through the first under bump metal 160, and a cover layer 180 disposed above the first encapsulant 130 and having an opening exposing at least a portion of the backside wiring layer 132.

The frame 110 may improve the rigidity of the first semiconductor package 100A according to a detailed material of insulating layers 111a and 111b, and may serve to secure thickness uniformity of the first encapsulant 130 or the like. The frame 110 may have the penetrating portion 110H penetrating through the insulating layers 111a and 111b. The first semiconductor chip 120 is disposed in the penetrating portion 110H, and passive components (not illustrated) may also be disposed together therewith, as required. The penetrating portion 110H may have the form in which a wall surface thereof surrounds the first semiconductor chip 120, but an example embodiment thereof is not limited thereto. The frame 110 includes wiring layers 112a, 112b and 112c and wiring vias 113a and 113b in addition to the insulating layers 111a and 111b, and may thus function as an electrical connecting member providing a vertical electrical connection path. As the frame 110, an electrical connecting member, capable of providing another type of vertical electrical connecting path, such as a metal post, may be introduced.

In an example, the frame 110 may include a first insulating layer 111a, a first wiring layer 112a in contact with the first connection structure 140 and embedded in the first insulating layer 111a, a second wiring layer 112b disposed on a side of the first insulating layer 111a, opposing a side of the first insulating layer 111a, in which the first wiring layer 112a is embedded, a second insulating layer 111b disposed on the side of the first insulating layer 111a, opposing the side of the first insulating layer 111a, in which the first wiring layer 112a is embedded, the second insulating layer 111b covering at least a portion of the second wiring layer 112b, and a third wiring layer 112c disposed on a side of the second insulating layer 111b, opposing a side of the second insulating layer 111b, in which the second wiring layer 112b is embedded. The first and second wiring layers 112a and 112b, and the second and third wiring layers 112b and 112c, and are electrically connected to each other through first and second wiring vias 113a and 113b, penetrating through the first and second insulating layers 111a and 111b, respectively. The first to third wiring layers 112a, 112b and 112c may be electrically connected to the first connection pad 122 through the first redistribution layer 142 and the first connection via 143 of the first connection structure 140, depending on a function thereof.

The material of the insulating layers 111a and 111b is not particularly limited. For example, an insulating material may be used. As the insulating material, a thermosetting resin such as an epoxy resin, a thermoplastic resin such as polyimide, or a resin in which these resins are mixed with an inorganic filler, for example, Ajinomoto Build-up Film (ABF), may be used. Alternatively, a material in which the resin described above is impregnated with a core material such as a glass fiber, a glass cloth, a glass fabric or the like, together with an inorganic filler, for example, a prepreg resin or the like may be used.

The wiring layers 112a, 112b and 112c together with the wiring vias 113a and 113b may provide an electrical connection path between upper and lower portions of the package, and may serve to redistribute the first connection pad 122. The wiring layers 112a, 112b and 112c may be formed using a metal material, such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions according to the design of a relevant layer. For example, the wiring layers may include a ground (GrouND: GND) pattern, a power (PoWeR: PWR) pattern, a signal (Signal: S) pattern, or the like. In this case, the signal S pattern includes various signals except for the ground (GND) pattern, the power (PWR) pattern and the like, for example, includes a data signal. The ground (GND) pattern and the power (PWR) pattern may be the same pattern. The wiring layers 112a, 112b and 112c may include various types of via pads and the like. The wiring layers 112a, 112b, and 112c may be formed by a known plating process, and may each include a seed layer and a plating layer.

A thickness of each of the wiring layers 112a, 112b and 112c may be greater than a thickness of the first redistribution layer 142. In detail, the frame 110 may have a thickness equal to or greater than that of the first semiconductor chip 120. To maintain rigidity, since a prepreg or the like is selected as the material of the insulating layers 111a and 111b, the thickness of the wiring layers 112a, 112b and 112c may also be relatively thick. On the other hand, the first connection structure 140 requires a microcircuit and a high-density design. Therefore, a photoimageable dielectric (PID) material or the like is selected as a material of a first insulating layer 141, and thus, the first redistribution layer 142 may also have a relatively reduced thickness.

The first wiring layer 112a may be recessed into the first insulating layer 111a. As described above, in a case in which the first wiring layer 112a is recessed into the first insulating layer 111a in such a manner that a surface of the first insulating layer 111a in contact with the first connection structure 140 and a surface of the first wiring layer 112a in contact with the first connection structure 140 have a step therebetween, when the first semiconductor chip 120 and the frame 110 are encapsulated with the first encapsulant 130, a formation material may be prevented from bleeding and contaminating the first wiring layer 112a.

The wiring vias 113a and 113b electrically connect the wiring layers 112a, 112b and 112c formed in different layers, thereby forming an electrical path in the frame 110. The wiring vias 113a and 113b may be formed using a metal material, such as copper (Cu), aluminum (Al), silver (Ag), tin (Sn), gold (Au), nickel (Ni), lead (Pb), titanium (Ti), or alloys thereof. The wiring vias 113a and 113b may include a signal via, a power via, a ground via, and the like, and the power via and the ground via may be the same vias. The wiring vias 113a and 113b may each be a filled-type via filled with a metal material, or may be a conformal type via formed as a metal material is formed along a wall surface of a via hole. Further, the wiring vias 113a and 113b may respectively have a tapered shape. The wiring vias 113a and 113b may be formed by a plating process, and may be comprised of a seed layer and a conductor layer.

A portion of a pad of the first wiring layer 112a may serve as a stopper when a hole for the first wiring via 113a is formed. A taper shape in which a width of an upper surface of the first wiring via 113a is greater than a width of a lower surface of thereof may be advantageous in terms of the process. In this case, the first wiring via 113a may be integrated with the pad pattern of the second wiring layer 112b. When forming a hole for the second wiring via 113b, a portion of a pad of the second wiring layer 112b may serve as a stopper. A taper shape in which a width of an upper surface of the second wiring via 113b is greater than a width of a lower surface thereof may be advantageous in terms of the process. In this case, the second wiring via 113b may be integrated with the pad pattern of the third wiring layer 112c.

Although not illustrated in the drawings, a metal layer (not illustrated) may be disposed on a wall surface of the penetrating portion 110H of the frame 110 to shield electromagnetic waves or dissipate heat as required, and may surround the first semiconductor chip 120.

The first semiconductor chip 120 may be an integrated circuit (IC) in which hundreds to millions of devices are integrated into a single chip. In this case, the integrated circuit constituting the first semiconductor chip 120 may include an application processor (AP) including an image signal processor (ISP) as described above. The first semiconductor chip 120 may be an integrated circuit in a bare state in which no separate bump or wiring layer is formed, but an embodiment thereof is not limited thereto. For example, the first semiconductor chip 120 may be a packaged type integrated circuit, as necessary. The integrated circuit may be formed based on an active wafer. In this case, silicon (Si), germanium (Ge), gallium arsenide (GaAs), or the like may be used as a base material of a body 121 of the first semiconductor chip 120. The body 121 may have various circuits. The first connection pad 122 is provided to electrically connect the first semiconductor chip 120 to other components. As a material of the first connection pad 122, a metal material such as copper (Cu), aluminum (Al) or the like may be used without any particular limitation. A passivation film 123 may be formed on the body 121 to expose the first connection pad 122. The passivation film 123 may be an oxide film or a nitride film, or may be a double layer of the oxide film and the nitride film. In addition, in this case, an insulating film (not illustrated) or the like may be further disposed on required positions. On the other hand, a surface of the first semiconductor chip 120, on which the first connection pad 122 is disposed, is an active surface, and an opposite surface thereto, a back surface thereof becomes an inactive surface. In some cases, the connection pad may be disposed on the back surface, such that both sides may be active surfaces. In an example, in the case in which the passivation film 123 is formed on the active surface of the first semiconductor chip 120, a positional relation of the active surface of the first semiconductor chip 120 is determined, based on a lowermost surface of the passivation film 123.

The first encapsulant 130 covers at least portions of the first semiconductor chip 120 and the frame 110, and fills at least a portion of the penetrating portion 110H. The first encapsulant 130 includes an insulating material. As the insulating material thereof, a non-photoimageable dielectric material, in detail, a non-photoimageable dielectric material including an inorganic filler and an insulating resin may be used. For example, a thermosetting resin such as an epoxy resin, a thermoplastic resin such as polyimide, or a resin in which a reinforcing material such as an inorganic filler is included in these resins, in detail, ABF or EMC may be used. A material, in which an insulating resin such as a thermosetting resin or a thermoplastic resin is impregnated with a core material such as an inorganic filler and/or a glass fiber, may also be used, as required. Thus, a problem such as void and undulation may be reduced, and warpage control may also be facilitated. Photoimageable encapsulant (PIE) may also be used as required.

The backside wiring layer 132 is disposed on the first encapsulant 130 to provide a backside circuit to the first semiconductor package 100A together with the backside via 133. The backside wiring layer 132 may include a metal material such as copper (Cu), aluminum (Al), silver (Ag), tin (Sn), gold (Au), nickel (Ni), lead (Pb), titanium (Ti), or alloys thereof. The backside wiring layer 132 may perform various functions depending on the design. For example, the backside wiring layer 132 may include a ground (GND) pattern, a power (PWR) pattern, a signal (S) pattern, and the like. In this case, the signal (S) pattern includes various signals, for example, a data signal, except for the ground (GND) pattern, the power (PWR) pattern, and the like. The ground (GND) pattern and the power (PWR) pattern may be the same pattern. The backside wiring layer 132 may be formed by a known plating process, and may be comprised of a seed layer and a conductor layer.

The backside via 133 penetrates through the first encapsulant 130 and electrically connects the backside wiring layer 132 to the third wiring layer 112c which is an uppermost wiring layer 112c. The backside via 133 may also include a metal material such as copper (Cu), aluminum (Al), silver (Ag), tin (Sn), gold (Au), nickel (Ni), lead (Pb), titanium (Ti), or alloys of these metals. The backside via 133 may also be a filled type via filled with a metal material, or may also be a conformal-type via formed as a metal material is formed along the wall surface of a via hole. Further, the backside via 133 may have a taper shape in the same direction as a direction in which the wiring vias 113a and 113b are tapered. The backside via 133 may also include a signal via, a ground via, a power via, and the like. The power via and the ground via may be the same vias. The backside via 133 may be formed by a known plating process, and may be comprised of a seed layer and a conductor layer.

The first connection structure 140 may redistribute the first connection pad 122 of the first semiconductor chip 120. The first connection pad, for example, several tens to hundreds of first connection pads 122 of the first semiconductor chip 120, having various functions, may be redistributed through the first connection structure 140, and may be physically and/or electrically connected externally through first electrical metals 170 depending on the functions thereof. The first connection structure 140 includes a first insulating layer 141, a first redistribution layer 142 disposed on a lower surface of the first insulating layer 141, and a first connection via 143 connected to the first redistribution layer 142 while penetrating through the first insulating layer 141. The numbers of the first insulating layer 141, the first redistribution layer 142, and the first connection via 143 may be more or less than those illustrated in the drawings. For example, the number of layers may change depending on the design.

As a material of the first insulating layer 141, an insulating material may be used. In this case, a photoimageable dielectric material (PID) may be used as the insulating material. In this case, a fine pitch may be introduced through the photovia, which is advantageous in terms of the fine circuit and high-density design, such that tens to millions of the first connection pads 122 of the first semiconductor chip 120 may be redistributed significantly efficiently. A boundary of the first insulating layer 141 may be distinct or boundaries therebetween may be unclear.

The first redistribution layer 142 may redistribute the first connection pads 122 of the first semiconductor chip 120 to electrically connect the redistributed first connection pads to the first electrical connection metals 170. The first redistribution layer 142 may also be formed using a metal material, such as copper (Cu), aluminum (Al), silver (Ag), tin (Sn), gold (Au), nickel (Ni), lead (Pb), titanium (Ti), or alloys thereof. The first redistribution layer 142 may also perform various functions according to the design, and for example, may include a ground (GND) pattern, a power (PWR) pattern, a signal (S) pattern, and the like. The ground (GND) pattern and the power (PWR) pattern may be the same pattern. In addition, the first redistribution layer 142 may include various types of via pads, electrical connection metal pads, and the like. The first redistribution layer 142 may be formed by a plating process, and may be comprised of a seed layer and a conductor layer.

The first connection via 143 electrically connects the first redistribution layers 142 formed in different layers, and electrically connect the first connection pads 122 of the first semiconductor chip 120 and the first wiring layer 112a of the frame 110 to the first redistribution layer 142. The first connection via 143 may be in physical contact with the first connection pad 122 when the first semiconductor chip 120 is a bare die. The first connection via 143 may be formed using a metal material such as copper (Cu), aluminum (Al), silver (Ag), tin (Sn), gold (Au), nickel (Ni), lead (Pb) titanium (Ti), or alloys thereof. The first connection via 143 may include signal vias, power vias, ground vias, and the like. The power vias and ground vias may be the same vias. The first connection via 143 may also be a filled-type via filled with a metal material, or may be a conformal type via formed as a metal material is formed along a wall surface of a via hole. Further, the first connection via 143 may have a taper shape tapered in a direction opposite to a direction in which the wiring vias 113a and 113b are tapered. The first connection via 143 may be formed by a plating process, and may be comprised of a seed layer and a conductor layer.

The first passivation layer 150 is an additional structure for protecting the first connection structure 140 from external physical chemical damage or the like. The first passivation layer 150 may include a thermosetting resin. For example, the first passivation layer 150 may be ABF, but is not limited thereto. The first passivation layer 150 has an opening exposing at least a portion of a lowermost first redistribution layer 142 among the first redistribution layers 142. The opening may be tens to tens of thousands of openings, and may also be more or less. Each opening may be composed of a plurality of holes. A surface mount component such as a capacitor may be disposed on a lower surface of the first passivation layer 150, to be electrically connected to the first redistribution layer 142 and thus be electrically connected to the first semiconductor chip 120.

The first under bump metal 160 is also an additional configuration, to improve connection reliability of the first electrical connection metal 170, and as a result, may improve board level reliability of the first semiconductor package 100A. The first under bump metal 160 may be provided as tens to millions of under bump metals, and may be more or less. Each first under bump metal 160 may be formed in the opening of the first passivation layer 150 to be electrically connected to an exposed lowermost first redistribution layer 142. The first under bump metal 160 may be formed using a metal by a known metallization method, but a formation method thereof is not limited thereto.

The first electrical connection metal 170 is also an additionally configured structure for physically and/or electrically connecting the first semiconductor package 100A externally. For example, the first semiconductor package 100A may be mounted on a main board of an electronic device through the first electrical connection metal 170. The first electrical connection metal 170 may be disposed on a lower side of the first passivation layer 150, and may be electrically connected to the first under bump metal 160, respectively. The first electrical connection metal 170 may respectively be composed of a low melting point metal, for example, tin (Sn) or an alloy containing tin (Sn). In detail, the first electrical connection metal 170 may be formed of a solder or the like, but the material thereof is merely an example, and thus, is not particularly limited.

The first electrical connection metal 170 may be a land, a ball, a pin, or the like. The first electrical connection metal 170 may be formed of a multilayer or a single layer, and may include a copper pillar and a solder when formed of a multilayer, and may include tin-silver solder or copper when formed of a single layer, by way of examples, but an example embodiment thereof is not limited thereto. The number, spacing, arrangement type, and the like of the first electrical connection metal 170 are not particularly limited and may be sufficiently modified by a person skilled in the art according to design specifications. For example, the number of first electrical connection metals 170 may be from tens to millions, depending on the number of first connection pads 122, and may be more or less.

At least one of the first electrical connection metals 170 is disposed in a fan-out area. The fan-out area refers to an area outside of the area in which the first semiconductor chip 120 is disposed. A fan-out package is more reliable than that of the fan-in package, allows a large amount of I/O terminals, and facilitates 3D interconnection. Compared with a ball grid array (BGA) package and a land grid array (LGA) package, the fan-out package may have a relatively reduced package thickness and excellent price competitiveness.

The cover layer 180 is an additional structure for protecting the backside wiring layer 132 from external physical chemical damage or the like. The cover layer 180 may include a thermosetting resin. For example, the cover layer 180 may be ABF, but is not limited thereto. The cover layer 180 has an opening exposing at least a portion of the backside wiring layer 132. The opening may be tens to tens of thousands of openings, and may be more or less. Each opening may be composed of a plurality of holes.

Figure 12:
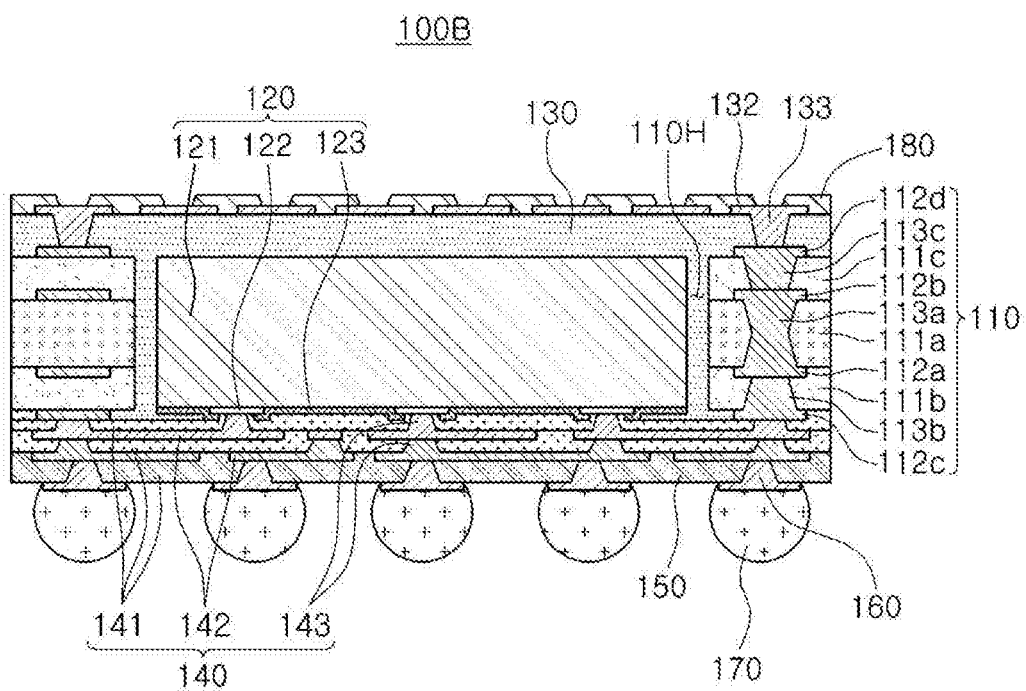
FIG. 12 is a cross-sectional view schematically illustrating another example of the first semiconductor package applied to the package-on-package of FIG. 9.

FIG. 12 is a cross-sectional view schematically illustrating another example of the first semiconductor package applied to the package-on-package of FIG. 9.

Referring to the drawings, in the case of a first semiconductor package 100B according to another embodiment, a frame 110 has a different shape from that in the first semiconductor package 100A according to the above-described embodiment. In detail, the frame 110 of the first semiconductor package 100B includes a first insulating layer 111a, a first wiring layer 112a and a second wiring layer 112b disposed on both surfaces of the first insulating layer 111a, respectively, a second insulating layer 111b and a third insulating layer 111c disposed on both surfaces of the first insulating layer 111a, respectively, and covering the first and second wiring layers 112a and 112b, respectively, a third wiring layer 112c disposed on a side of the second insulating layer 111b, opposite to a side of the second insulating layer 111b in which the first wiring layer 112a is embedded, a fourth wiring layer 112d disposed on a side of the third insulating layer 111c, opposite to a side of the third insulating layer 111c in which the second wiring layer 112b is embedded, a first wiring via 113a penetrating through the first insulating layer 111a and electrically connecting the first and second wiring layers 112a and 112b, a second wiring via 113b penetrating through the second insulating layer 111b and electrically connecting the first and third wiring layers 112a and 113c, and a third wiring via 113c penetrating through the third insulating layer 111c and electrically connecting the second and fourth wiring layers 112b and 112d. Since the frame 110 includes a relatively larger number of wiring layers 112a, 112b, 112c and 112d, a first connection structure 140 may be further simplified.

The first insulating layer 111a may have a thickness greater than those of the second insulating layer 111b and the third insulating layer 111c. The first insulating layer 111a may be relatively thick to maintain rigidity, and the second insulating layer 111b and the third insulating layer 111c may be formed to have a relatively larger number of wiring layers 112c and 112d. In a similar aspect, the first wiring via 113a passing through the first insulating layer 111a may have a height and an average diameter greater than those of the second and third wiring vias 113b and 113c passing through the second and third insulating layers 111b and 111c. Further, the first wiring via 113a may have an hourglass or cylindrical shape, while the second and third wiring vias 113b and 113c may have taper shapes opposite to each other. The thickness of each of the wiring layers 112a, 112b, 112c and 112d may be greater than the thickness of the first redistribution layer 142.

Other details are substantially the same as those described in the first semiconductor package 100A according to the embodiment, and a detailed description thereof will be omitted.

Figure 13:
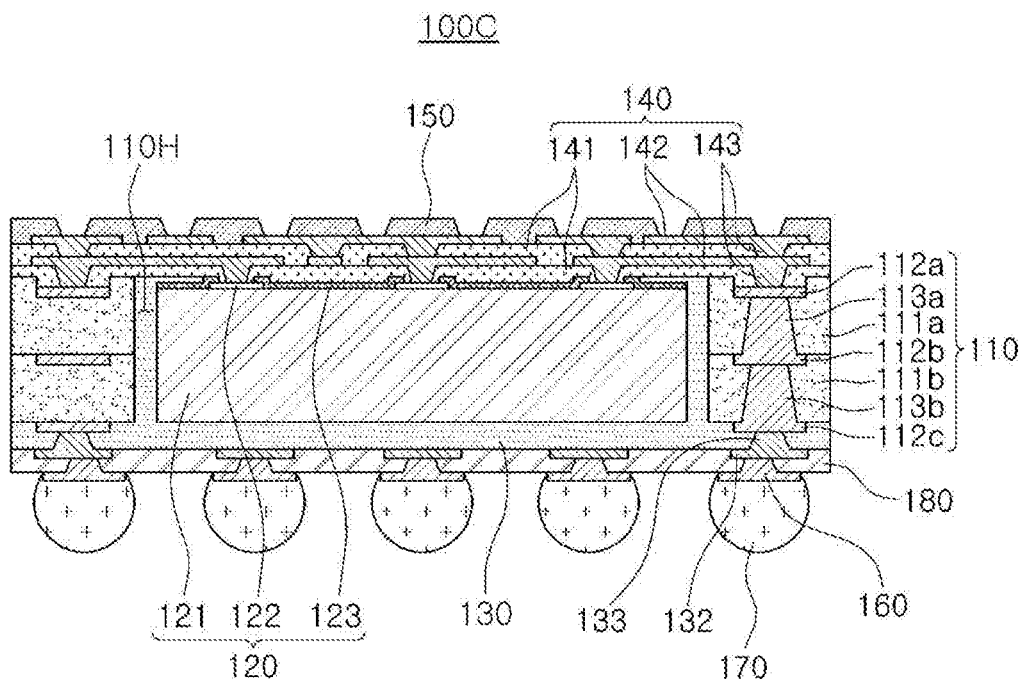
FIG. 13 is a cross-sectional view schematically illustrating another example of the first semiconductor package applied to the package-on-package of FIG. 9.

FIG. 13 is a cross-sectional view schematically illustrating another example of the first semiconductor package applied to the package-on-package of FIG. 9.

Referring to FIG. 13, in the case of a first semiconductor package 100C according to another example, a first semiconductor chip 120 is disposed in a face-up manner, not in a face-down manner as in the first semiconductor package 100A according to the above-described example. Thus, a first connection structure 140 and a first passivation layer 150 are also disposed in an upper side of the first semiconductor package 100C, not in a lower side thereof. A backside wiring layer 132, a backside via 133, and a cover layer 180 are disposed in the lower side of the first semiconductor package 100C, not in the upper side thereof. A first under bump metal 160 is formed in an opening formed in the cover layer 180 to be connected to an exposed backside wiring layer 132. A first electrical connection metal 170 is formed on a lower side of the cover layer 180, to be electrically connected to the backside wiring layer 132 exposed through the first under bump metal 160. With such a structure, an electrical connection path between the first semiconductor chip 120 and the second semiconductor chip 220 described above is significantly reduced, promoting performance improvement.

Other details are substantially the same as those described with reference to the first semiconductor package 100A according to the example, and a detailed description thereof will be omitted.

Figure 14:
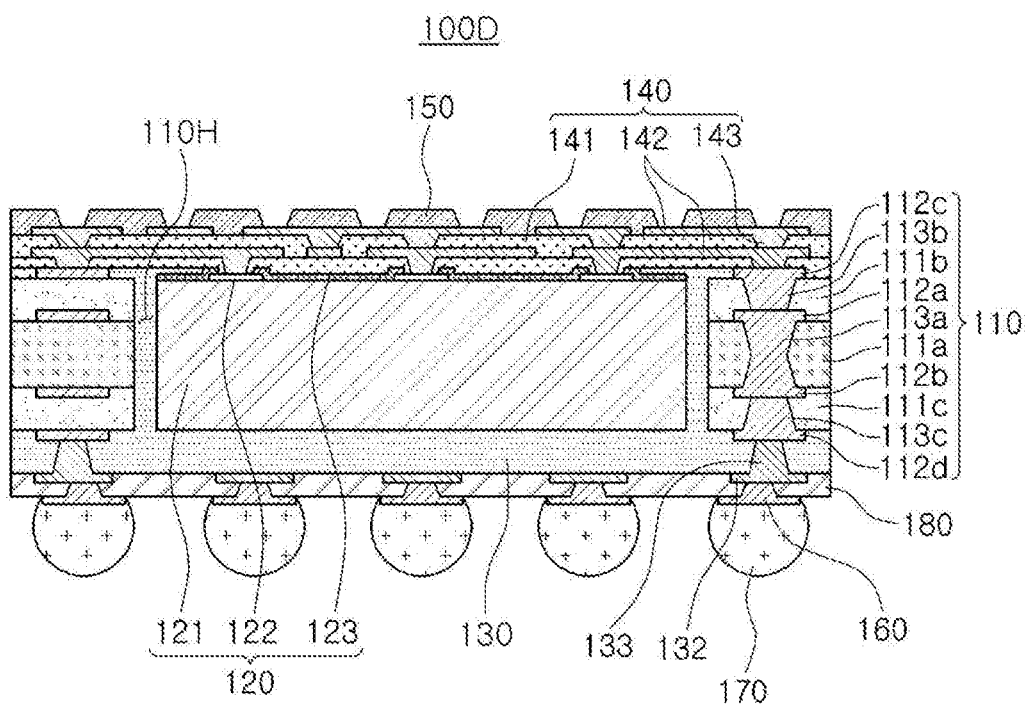
FIG. 14 is a cross-sectional view schematically illustrating another example of the first semiconductor package applied to the package-on-package of FIG. 9.

FIG. 14 is a cross-sectional view schematically illustrating another example of the first semiconductor package applied to the package-on-package of FIG. 9.

Referring to FIG. 14, in the case of a first semiconductor package 100D according to another example, a first semiconductor chip 120 is disposed in a face-up manner, not in a face-down manner as in the first semiconductor package 100B according to the above-described example. Thus, a first connection structure 140 and a first passivation layer 150 are also disposed in an upper side of the first semiconductor package 100D, not in a lower side thereof. A backside wiring layer 132, a backside via 133, and a cover layer 180 are disposed in the lower side of the first semiconductor package 100D, not in the upper side thereof. A first under bump metal 160 is formed in an opening formed in the cover layer 180 to be connected to an exposed backside wiring layer 132. A first electrical connection metal 170 is formed on a lower side of the cover layer 180, to be electrically connected to the backside wiring layer 132 exposed through the first under bump metal 160. With such a structure, an electrical connection path between the first semiconductor chip 120 and the second semiconductor chip 220 described above is significantly reduced, promoting performance improvement.

Other details are substantially the same as those described with reference to the first semiconductor package 100A according to the example and the first semiconductor package 100B according to another example, and thus, a detailed description will be omitted.

Figure 15:
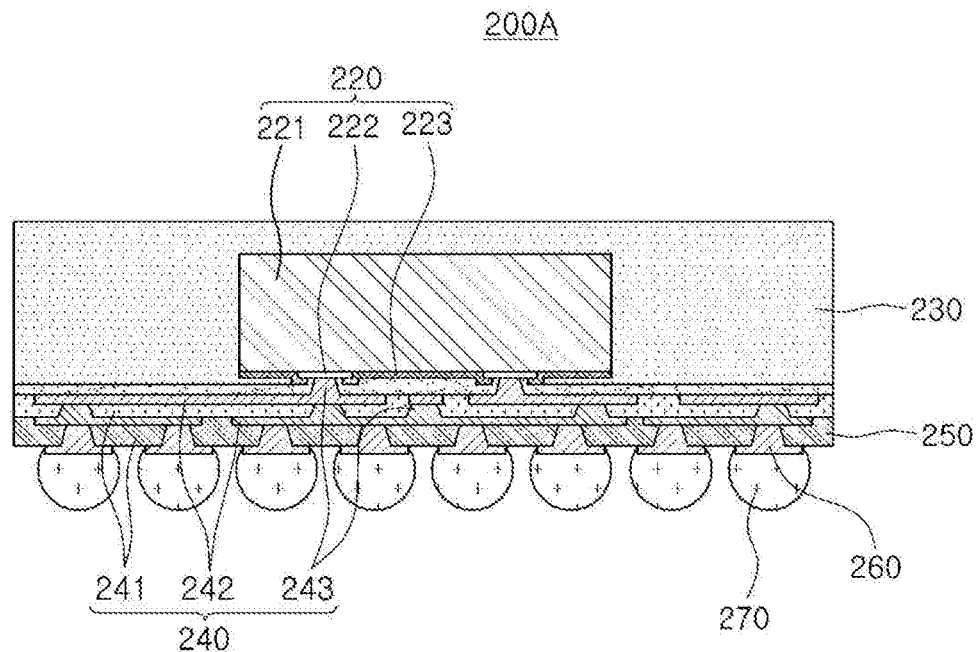
FIG. 15 is a cross-sectional view schematically illustrating an example of a second semiconductor package applied to the package-on-package of FIG. 9.

FIG. 15 is a cross-sectional view schematically illustrating an example of a second semiconductor package applied to the package-on-package of FIG. 9.

Referring to FIG. 15, a second semiconductor package 200A according to an example includes a second semiconductor chip 220 having a second connection pad 222, a second encapsulant 220 covering at least a portion of the second semiconductor chip 220, a second connection structure 240 disposed below the second semiconductor chip 220 and including one or more second redistribution layers 242 electrically connected to the second connection pad 222, a second passivation layer 250 disposed below the second connection structure 240 and having openings exposing at least portions of the one or more second redistribution layers 242, a second under bump metal 260 disposed on the opening of the second passivation layer 250 and electrically connected to an exposed second redistribution layer 242, and a second electrical connection metal 270 disposed on a lower side of the second passivation layer 250 and electrically connected to the second redistribution layer 242 exposed through the second under bump metal 260.

The second semiconductor chip 220 may be an integrated circuit (IC) in which hundreds to millions of devices are integrated into a single chip. In this case, the integrated circuit constituting the second semiconductor chip 120 may include an image signal processor as described above. The second semiconductor chip 220 may be an integrated circuit in a bare state in which no separate bump or wiring layer is formed, but an embodiment thereof is not limited thereto. For example, the second semiconductor chip 220 may be a packaged type integrated circuit, as necessary. The integrated circuit may be formed based on an active wafer. In this case, silicon (Si), germanium (Ge), gallium arsenide (GaAs), or the like may be used as a base material of a body 221 of the second semiconductor chip 220. The body 221 may have various circuits. The second connection pad 222 is provided to electrically connect the second semiconductor chip 220 to other components. As a material of the second connection pad 222, a metal material such as copper (Cu), aluminum (Al) or the like may be used without any particular limitation. A passivation film 223 may be formed on the body 221 to expose the second connection pad 222. The passivation film 223 may be an oxide film or a nitride film, or may be a double layer of the oxide film and the nitride film. In addition, in this case, an insulating film (not illustrated) or the like may be further disposed on required positions. On the other hand, a surface of the second semiconductor chip 220, on which the second connection pad 222 is disposed, is an active surface, and an opposite surface thereto, a back surface thereof becomes an inactive surface. In some cases, the connection pad may be disposed on the back surface, such that both sides may be active surfaces. In an example, in the case in which the passivation film 223 is formed on the active surface of the second semiconductor chip 220, a positional relation of the active surface of the second semiconductor chip 220 is determined, based on a lowermost surface of the passivation film 223.

A second encapsulant 230 covers at least a portion of the second semiconductor chip 220. The second encapsulant 230 includes an insulating material. As the insulating material thereof, a non-photoimageable dielectric material, in detail, a non-photoimageable dielectric material including an inorganic filler and an insulating resin may be used. For example, a thermosetting resin such as an epoxy resin, a thermoplastic resin such as polyimide, or a resin in which a reinforcing material such as an inorganic filler is included in these resins, in detail, ABF or EMC may be used. A material, in which an insulating resin such as a thermosetting resin or a thermoplastic resin is impregnated with a core material such as an inorganic filler and/or a glass fiber, may also be used, as required. Thus, a problem such as void and undulation may be reduced, and warpage control may also be facilitated. PIE may also be used as required.

A second connection structure 240 may redistribute the second connection pad 222 of the second semiconductor chip 220. The second connection pad, for example, several tens to hundreds of second connection pads 222 of the second semiconductor chip 220, having various functions, may be redistributed through the second connection structure 240, and may be physically and/or electrically connected externally through second electrical metals 270 depending on the functions thereof. The second connection structure 240 includes a second insulating layer 241, a second redistribution layer 242 disposed on a lower surface of the second insulating layer 241, and a second connection via 243 connected to the second redistribution layer 242 while penetrating through the second insulating layer 241. The numbers of the second insulating layer 241, the second redistribution layer 242, and the second connection via 243 may be more or less than those illustrated in the drawings. For example, the number of layers may change depending on the design.

As a material of the second insulating layer 241, an insulating material may be used. In this case, a photoimageable dielectric material (PID) may be used as the insulating material. In this case, a fine pitch may be introduced through the photovia, which is advantageous in terms of the fine circuit and high-density design, such that tens to millions of the second connection pads 222 of the second semiconductor chip 220 may be redistributed significantly efficiently. A boundary of the second insulating layer 241 may be distinct or boundaries therebetween may be unclear.

The second redistribution layer 242 may redistribute the second connection pads 222 of the second semiconductor chip 220 to electrically connect the redistributed second connection pads to the second electrical connection metals 270. The second redistribution layer 242 may also be formed using a metal material, such as copper (Cu), aluminum (Al), silver (Ag), tin (Sn), gold (Au), nickel (Ni), lead (Pb), titanium (Ti), or alloys thereof. The second redistribution layer 242 may also perform various functions according to the design, and for example, may include a ground (GND) pattern, a power (PWR) pattern, a signal (S) pattern, and the like. The ground (GND) pattern and the power (PWR) pattern may be the same pattern. In addition, the second redistribution layer 242 may include various types of via pads, electrical connection metal pads, and the like. The second redistribution layer 242 may be formed by a plating process, and may be comprised of a seed layer and a conductor layer.

The second connection via 243 electrically connects second redistribution layers 242 formed in different layers, and electrically connect the second connection pads 222 of the second semiconductor chip 220 to the second redistribution layer 242. The second connection via 243 may be in physical contact with the second connection pad 222 when the second semiconductor chip 220 is a bare die. The second connection via 243 may be formed using a metal material such as copper (Cu), aluminum (Al), silver (Ag), tin (Sn), gold (Au), nickel (Ni), lead (Pb) titanium (Ti), or alloys thereof. The second connection via 243 may include signal vias, power vias, ground vias, and the like. The power vias and ground vias may be the same vias. The second connection via 243 may also be a filled-type via filled with a metal material, or may be a conformal type via formed as a metal material is formed along a wall surface of a via hole. Further, the second connection via 243 may have a taper shape. The second connection via 243 may also be formed by a plating process, and may be comprised of a seed layer and a conductor layer.

The second passivation layer 250 is an additional structure for protecting the second connection structure 240 from external physical chemical damage or the like. The second passivation layer 250 may include a thermosetting resin. For example, the second passivation layer 250 may be ABF, but is not limited thereto. The second passivation layer 250 has an opening exposing at least a portion of a lowermost second redistribution layer 242 among the second redistribution layers 242. The opening may be tens to tens of thousands of openings, and may also be more or less. Each opening may be composed of a plurality of holes. A surface mount component such as a capacitor may be disposed on a lower surface of the second passivation layer 250, to be electrically connected to the second redistribution layer 242 and thus be electrically connected to the second semiconductor chip 220.

The second under bump metal 260 is also an additional configuration, to improve connection reliability of the second electrical connection metal 270, and as a result, may improve board level reliability of the second semiconductor package 200A. The second under bump metal 260 may be provided as tens to millions of under bump metals, and may be more or less. Each second under bump metal 260 may be formed in the opening of the second passivation layer 250 to be electrically connected to an exposed lowermost second redistribution layer 242. The second under bump metal 260 may be formed using a metal by a known metallization method, but a formation method thereof is not limited thereto.

The second electrical connection metal 270 is also an additionally configured structure for physically and/or electrically connecting the second semiconductor package 200A to the above-described first semiconductor package 100, 100A, 100B, 100C or 100D. The second electrical connection metal 270 may be disposed on a lower side of the second passivation layer 250, and may be electrically connected to the second under bump metal 260, respectively. The second electrical connection metal 270 may respectively be composed of a low melting point metal, for example, tin (Sn) or an alloy containing tin (Sn). In detail, the second electrical connection metal 270 may be formed of a solder or the like, but the material thereof is merely an example, and thus, is not particularly limited.

The second electrical connection metal 270 may be a land, a ball, a pin, or the like. The second electrical connection metal 270 may be formed of a multilayer or a single layer, and may include a copper pillar and a solder when formed of a multilayer, and may include tin-silver solder or copper when formed of a single layer, by way of examples, but an example embodiment thereof is not limited thereto. The number, spacing, arrangement type, and the like of the second electrical connection metal 270 are not particularly limited and may be sufficiently modified by a person skilled in the art according to design specifications. For example, the number of second electrical connection metals 270 may be from tens to millions, depending on the number of second connection pads 222, and may be more or less.

At least one of the second electrical connection metals 270 is disposed in a fan-out area. The fan-out area refers to an area outside of the area in which the second semiconductor chip 220 is disposed. A fan-out package is more reliable than that of a fan-in package, allows a large amount of I/O terminals, and facilitates 3D interconnection. Compared with a ball grid array (BGA) package and a land grid array (LGA) package, the fan-out package may have a relatively reduced package thickness and excellent price competitiveness.

Figure 16:
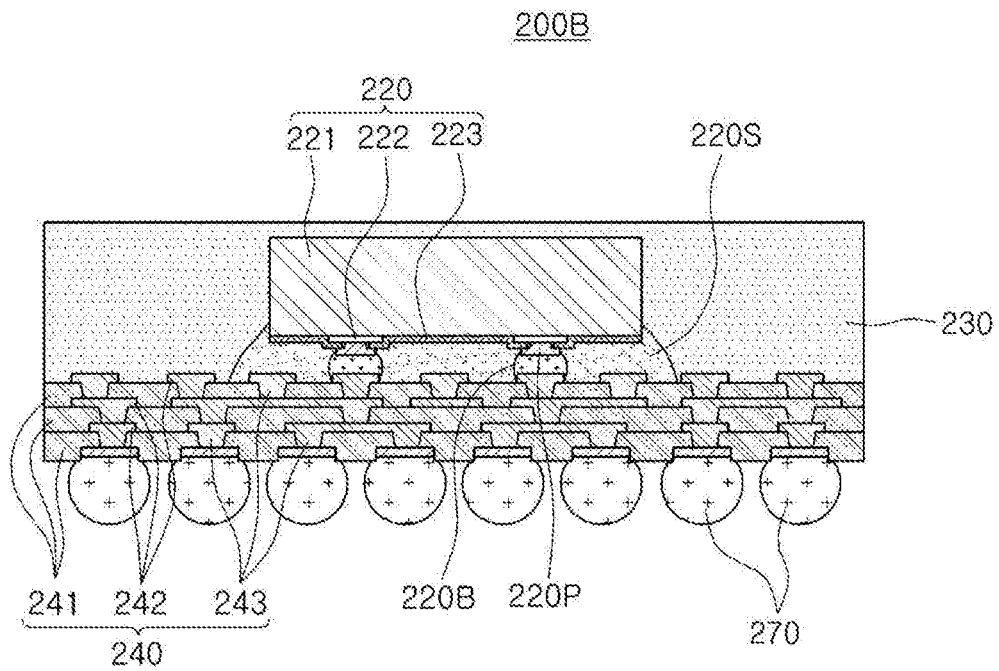
FIG. 16 is a cross-sectional view schematically illustrating another example of the second semiconductor package applied to the package-on-package of FIG. 9.

FIG. 16 is a cross-sectional view schematically illustrating another example of the second semiconductor package applied to the package-on-package of FIG. 9.

Referring to FIG. 16, in a second semiconductor package 200B according to another example, a second connection structure 240 is in the form of an organic interposer. In this case, a second semiconductor chip 220 may be disposed on the second connection structure 240 using Surface Mount Technology (SMT). For example, a metal bump 220P formed of plating of metal such as copper (Cu) may be disposed on a second connection pad 222 of the second semiconductor chip 220, and the metal bump 220P may be connected to a pad pattern protruding on the surface of the second redistribution layer 242 of the second connection structure 240 through a third electrical connection metal 220B such as a solder paste or the like. For example, the second semiconductor chip 220 may be physically separated from the second connection structure 240. A gap between the second semiconductor chip 220 and the second connection structure 240 is filled with an underfill resin 220S, in such a manner that the third electrical connection metal 220B or the like may be embedded therein, thereby more firmly fixing the second semiconductor chip 220.

Other details are substantially the same as those described with reference to the second semiconductor package 200A according to the example, and a detailed description thereof will be omitted.

Figure 17:
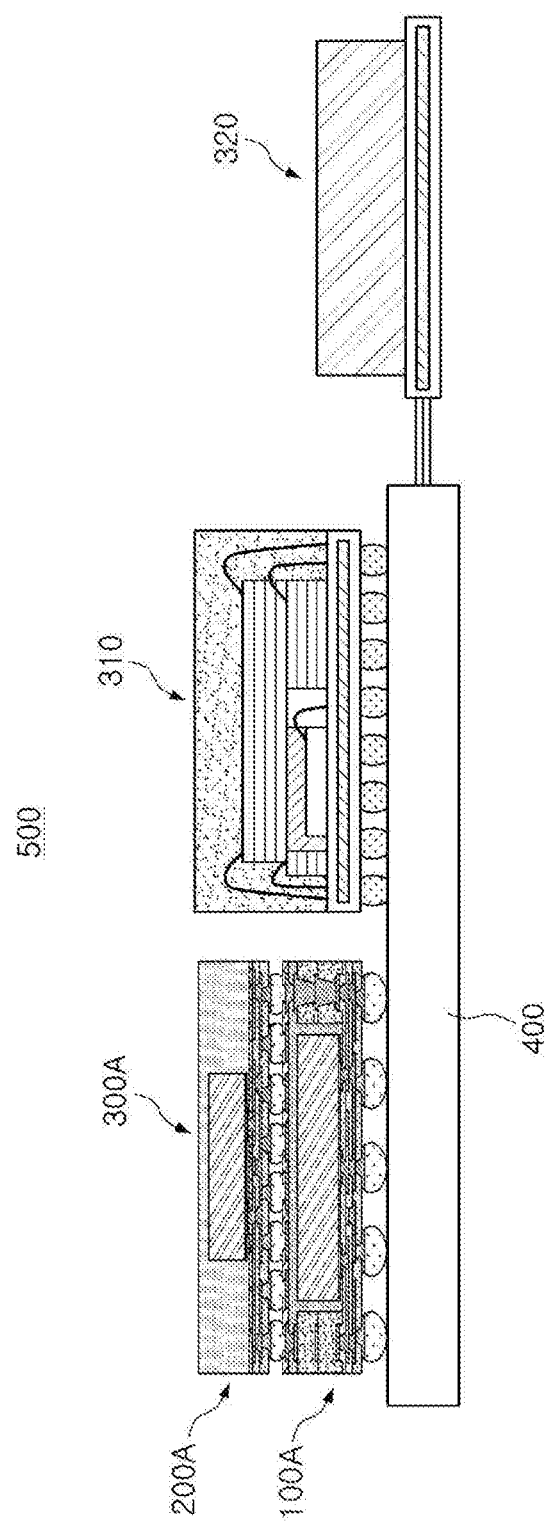
FIG. 17 is a cross-sectional view schematically illustrating an example of a package connection system.

FIG. 17 is a cross-sectional view schematically illustrating an example of a package connection system.

Referring to FIG. 17, a package connection system 500 according to an example includes a printed circuit board 400, a package-on-package 300A disposed on the printed circuit board 400, a memory package 310 disposed on the printed circuit board 400 and having a memory function, and an image sensor package 320 electrically connected to the printed circuit board.

The package-on-package 300A has a stacking structure of the first semiconductor package 100A according to the above-described example and the second semiconductor package 200A according to the above-described example. For example, the package-on-package includes a first semiconductor package including a first semiconductor chip, and a second semiconductor package disposed on the first semiconductor package and including a second semiconductor chip electrically connected to the first semiconductor chip. The first semiconductor chip includes an application processor (AP) including a first image signal processor (ISP). The second semiconductor chip includes one or more second image signal processors (ISP) distinct from the first image signal processor (ISP).

An example of the package connection system 500 is not limited thereto. For example, the first semiconductor package 100B, 100C or 100D according to another example described above and the second semiconductor package 200B according to another example described above may also be stacked in various combinations, which may be applied to the package connection system 500 according to an example.

The application processor (AP) may further include one or more configurations other than the first image signal processor (ISP). For example, the application processor (AP) may further include one or more of a central processing unit (CPU), a graphics processing unit (GPU), a digital signal processor (DSP), a neural processing unit (NPU), a memory unit, and a general purpose input/output unit. In this case, a system-on-chip (SoC) in which each configuration constitutes a single system may be formed. All or a portion of the configurations of the application processor (AP) may be connected to other configurations.

Each of the first image signal processor (ISP) and the second image signal processor (ISP) may include an image receiving unit, an image processing unit, and an image transmitting unit, and may receive and process image data output from the configurations of an image sensor, a camera module, and the like, and may output the processed image data to a configuration in the application processor (AP) or a configuration outside of the application processor (AP), such as the memory package 310 or the like. The image processing unit may correct shake of the received image data, for example, and adjust a white balance.

The application processor (AP) may also be connected to other configurations via a bus structure. In addition, the application processor (AP) may have an interface for efficiently interfacing with the bus structure. In addition, the first image signal processor (ISP) and the second image signal processor (ISP) may share the interface of the application processor (AP). For example, the application processor (AP) may further include a memory interface, and the memory interface may be connected to the memory package 310 via the bus structure. In this case, each of the first image signal processor (ISP) and the second image signal processor (ISP) is electrically connected to the memory interface of the application processor (AP), and the memory interface may be connected to the memory package 310 via the bus structure.

The memory package 310 may be, but is not limited to, an embedded multi-chip package (eMCP) including a dynamic random access memory (DRAM), a flash memory, and a controller (CTR). The memory package 310 may store images output from the first image signal processor (ISP) and the second image signal processor (ISP) via the application processor (AP).

The printed circuit board 400 may be electrically connected to the image sensor package 320 including an image sensor. In this case, the first image signal processor (ISP) of the first semiconductor package 100A and the second image signal processor (ISP) of the second semiconductor package 100B may be respectively electrically connected to the image sensor package 320 via the printed circuit board 400. Therefore, raw data of an image imaged through a camera module is transmitted to the first image signal processor (ISP) and the second image signal processor (ISP) via the image sensor and the printed circuit board 400. The printed circuit board 400 may be a flexible printed circuit board (FPCB), and in this case, the image sensor package 320 may be electrically connected to the printed circuit board 400 through a FPCB connector. The image sensor may be a complementary metal oxide semiconductor (CMOS) image sensor, but is not limited thereto.

Meanwhile, recent mobile devices have utilized image signal processors (ISP) embedded in application processors (AP). In this case, the performance of a camera module is limited by the image signal processor (ISP) embedded in the application processor (AP). Furthermore, it is difficult to embed a high-end image signal processor (ISP) in the application processor (AP) in terms of a yield and costs. Recently, however, with the release of recent mobile devices including two or more camera modules such as a quad rear camera, a dual front camera and the like, an increase in the number of image signal processors (ISP) has been required. However, in the case of further configuring an image signal processor (ISP) in the application processor (AP), miniaturization and thinning of a semiconductor package may not be implemented, as the size of the application processor (AP) increases. Furthermore, with the introduction of an additional image signal processor (ISP), an application processor (AP) design burden, cost increase and yield reduction may be problematic.

As in the package-on-package 300 according to an example, separately from the first image signal processor (ISP) included in the application processor (AP) of the existing first semiconductor package 100, when the second image signal processor (ISP) is additionally configured in the second semiconductor package 200 to be connected thereto, the camera function may be enhanced by the increase in the number of image signal processors (ISP). In a case in which two or more camera modules or two or more image sensor packages 320, such as a quad rear camera, a dual front camera or the like, are included, raw data of an image imaged through one camera module/one image sensor package 320 is transmitted to the first image signal processor (ISP) and the second image signal processor (ISP) via the printed circuit board 400, and raw data of an image imaged through another camera module/another image sensor package 320 is transmitted to the first image signal processor (ISP) and the second image signal processor (ISP) via the printed circuit board 400. The first image signal processor (ISP) included in the application processor (AP) in the first semiconductor package 100A and the second image signal processor (ISP) in the second semiconductor package 200 may simultanouesly process the raw data.

In addition, since the first image signal processor (ISP) introduced additionally is not embedded in the application processor AP of the first semiconductor package 100, but is applied to a second semiconductor package 200 introduced additionally, the size of the first semiconductor package 100 may be maintained. In addition, a problem such as design burden, a cost increase, yield reduction or the like, which may occur in a case in which an additional image signal processor (ISP) is disposed in the application processor (AP), may be prevented.

In addition, latency may be significantly reduced when an interface of the application processor (AP) is shared by the first image signal processor (ISP) and the second image signal processor (ISP).

In the present inventive concept, the lower side, the lower portion, the lower surface and the like refer to the downward direction with respect to the cross section of the drawings for convenience, and the upper side, the upper portion, and the upper surface are used in the opposite direction. It should be noted, however, that this is a definition of a direction for the sake of convenience of explanation, and the scope of rights of the claims is not particularly limited by description of such direction.

The meaning of being connected in the present inventive concept encompasses not only a direct connection, but also includes an indirect connection. In addition, the term "electrically connected" means a concept including both a physical connection and non-connection. Further, the first and second expressions are used to distinguish one component from another component and do not limit the order and/or importance of components and the like. In some cases, without departing from the scope of the rights, a first component may be referred to as a second component, and similarly, a second component may also be referred to as a first component.

The expression, an example, used in this inventive concept does not mean the same embodiment, but is provided for emphasizing and explaining different unique features. However, the above-mentioned examples do not exclude being implemented in combination with the features of other examples. For example, although the description in the specific example is not described in another example, it may be understood as an explanation related to another example, unless otherwise described or contradicted by the other example.

As set forth above, according to an example, functions of a camera module may be diversified by introducing an additional image signal processor (ISP) as well as an image signal processor (ISP) embedded in an application processor (AP). In addition, problems such as an increase in the size of a semiconductor package, design burden, an increase in costs, a reduction in yield, and the like, which may occur in a case in which the additional image signal processor (ISP) is disposed in the application processor AP, may be prevented.

The terms used in this inventive concept are only used to illustrate an example and are not intended to limit the present inventive concept. The singular expressions include plural expressions unless the context clearly dictates otherwise.

What is claimed is:

1. A package-on-package comprising:
a first semiconductor package including a first semiconductor chip; and
a second semiconductor package disposed on the first semiconductor package and including a second semiconductor chip electrically connected to the first semiconductor chip,
wherein the first semiconductor chip includes an application processor (AP) including a first image signal processor (ISP), and
the second semiconductor chip includes a second image signal processor (ISP).

2. The package-on-package of claim 1, wherein the application processor further comprises at least one of a central processing unit (CPU), a graphics processing unit (GPU), a digital signal processor (DSP), a neural processing unit (NPU), a memory unit, and an input/output unit.

3. The package-on-package of claim 1, wherein the application processor further comprises a memory interface,
wherein the memory interface is respectively electrically connected to the first image signal processor and the second image signal processor.

4. The package-on-package of claim 3, wherein the memory interface of the application processor is shared by the first image signal processor and the second image signal processor.

5. The package-on-package of claim 1, wherein the first semiconductor package comprises a frame having a penetrating portion and including a wiring layer comprised of one or more layers, the first semiconductor chip disposed in the penetrating portion and having a first connection pad, a first encapsulant covering at least a portion of each of the frame and the first semiconductor chip, and a first connection structure disposed on the frame and the first semiconductor chip, and including a first redistribution layer comprised of one or more layers,
wherein the wiring layer of the frame is electrically connected to the first connection pad via the first redistribution layer of the first connection structure.

6. The package-on-package of claim 5, wherein the first semiconductor package further comprises a backside wiring layer disposed on a side of the first encapsulant, opposing a side of the first encapsulant, on which the first connection structure is disposed, and a backside via passing through the first encapsulant and electrically connecting the backside wiring layer and the wiring layer of the frame,
the second semiconductor package is disposed on the backside wiring layer and is electrically connected to the backside wiring layer through an electrical connection metal, and
the first semiconductor chip is disposed in a face-down manner in which a surface of the first semiconductor chip, on which the first connection pad is disposed, faces the first connection structure.

7. The package-on-package of claim 5, wherein the first semiconductor package further comprises a backside wiring layer disposed on a side of the first encapsulant, opposing a side of the first encapsulant, on which the first connection structure is disposed, and a backside via passing through the first encapsulant and electrically connecting the backside wiring layer and the wiring layer of the frame,
the second semiconductor package is disposed on the first connection structure and is electrically connected to the first redistribution layer of the first connection structure via an electrical connection metal, and
the first semiconductor chip is disposed in a face-up manner in which a surface of the first semiconductor chip, on which the first connection pad is disposed, faces the first connection structure.

8. The package-on-package of claim 5, wherein the frame comprises a first insulating layer, a first wiring layer in contact with the first connection structure and embedded in the first insulating layer, a second wiring layer disposed on a side of the first insulating layer, opposite to a side of the first insulating layer in which the first wiring layer is embedded, a second insulating layer disposed on a side of the first insulating layer, opposite to a side of the first insulating layer in which the first wiring layer is embedded, and covering at least a portion of the second wiring layer, and a third wiring layer disposed on a side of the second insulating layer, opposite to a side of the second insulating layer in which the second wiring layer is embedded,
wherein a surface of the first insulating layer, in contact with the first connection structure, has a step difference from a surface of the first wiring layer in contact with the first connection structure.

9. The package-on-package of claim 5, wherein the frame comprises a first insulating layer, a first wiring layer and a second wiring layer disposed on both surfaces of the first insulating layer, respectively, and a second insulating layer and a third insulating layer disposed on both surfaces of the first insulating layer, respectively, and covering at least portions of the first wiring layer and the second wiring layer, respectively, a third wiring layer disposed on a side of the second insulating layer, opposite to a side of the second insulating layer in which the first wiring layer is embedded, and a fourth wiring layer disposed on a side of the third insulating layer, opposite to a side of the third insulating layer in which the second wiring layer is embedded,
wherein the first insulating layer has a thickness greater than a thickness of each of the second and third insulating layers.

10. The package-on-package of claim 1, wherein the second semiconductor package comprises a second connection structure including a second redistribution layer comprised of one or more layers, the second semiconductor chip disposed on the second connection structure and including a second connection pad electrically connected to the second redistribution layer, and a second encapsulant disposed on the second connection structure and covering at least a portion of the second semiconductor chip.

11. A package connection system comprising:
a printed circuit board;
a package-on-package disposed on the printed circuit board; and
an image sensor package electrically connected to the package-on-package via the printed circuit board,
wherein the package-on-package includes a first semiconductor package including a first semiconductor chip, and a second semiconductor package disposed on the first semiconductor package and including a second semiconductor chip electrically connected to the first semiconductor chip,
wherein the first semiconductor chip includes an application processor (AP) including a first image signal processor (ISP), and the second semiconductor chip includes a second image signal processor (ISP).

12. The package connection system of claim 11, wherein the application processor further comprises at least one of a central processing unit (CPU), a graphics processing unit (GPU), a digital signal processor (DSP), a neural processing unit (NPU), a memory unit, and an input/output unit.

13. The package connection system of claim 11, further comprising a memory package disposed on the printed circuit board.

14. The package connection system of claim 13, wherein the application processor further comprises a memory interface electrically connected to the memory package,
   wherein the memory interface is respectively electrically connected to the first image signal processor (ISP) and the second image signal processor (ISP).

15. The package connection system of claim 14, wherein the first image signal processor and the memory package is connected to each other through the meory interface of the application process, and
   the second image signal processor and the memory package is connected to each other through the meory interface of the application process.

16. The package connection system of claim 13, wherein the memory package comprises a dynamic random access memory (DRAM), a flash memory, and a controller.

17. The package connection system of claim 11, wherein the printed circuit board includes a flexible printed circuit board (FPCB), and
   the image sensor package is electrically connected to the printed circuit board through a FPCB connector.

18. The package connection system of claim 11, further comprising another image sensor package electrically connected to the package-on-package via the printed circuit board,
   wherein the first image signal processor (ISP) is configured to process image data from the image sensor package and from the another image sensor package, and
   the second image signal processor (ISP) is configured to process image data from the image sensor package and from the another image sensor package.

* * * * *